United States Patent [19]

Takayama et al.

[11] Patent Number: 4,841,197
[45] Date of Patent: Jun. 20, 1989

[54] DOUBLE-CHAMBER ION SOURCE

[75] Inventors: Kazuo Takayama, Machida; Eiji Yabe, Shimizu; Kenichi Takagi, Chigasaki; Ryota Fukui, Hatano; Riichi Kikuchi, Chigasaki, all of Japan

[73] Assignee: Nihon Shinku Gijutsu Kabushiki Kaisha, Chigasaki, Japan

[21] Appl. No.: 55,804

[22] Filed: May 27, 1987

[30] Foreign Application Priority Data

| May 28, 1986 | [JP] | Japan | 61-121283 |
| May 28, 1986 | [JP] | Japan | 61-121284 |
| May 28, 1986 | [JP] | Japan | 61-121285 |
| May 30, 1986 | [JP] | Japan | 61-123652 |
| May 30, 1986 | [JP] | Japan | 61-123653 |
| Jul. 19, 1986 | [JP] | Japan | 61-169047 |

[51] Int. Cl.$^4$ .............. G01T 1/20; H01J 27/00
[52] U.S. Cl. .............. 315/111.81; 313/161; 313/230; 313/231.31; 313/359.1; 315/111.41; 315/358; 250/423 R
[58] Field of Search .............. 315/111.01, 111.11, 315/111.21, 111.41, 111.81, 358, 111.51; 313/230, 231.31, 359.1, 360.1, 161

[56] References Cited

U.S. PATENT DOCUMENTS

| 3,315,125 | 4/1967 | Fröhlich | 315/111.81 |
| 3,678,334 | 7/1972 | Dugdale et al. | 315/111.81 |
| 3,702,416 | 11/1972 | Bex et al. | 315/111.51 |
| 3,924,134 | 12/1975 | Uman et al. | 315/111.81 X |
| 4,123,686 | 10/1978 | Keller et al. | 313/230 |
| 4,288,716 | 9/1981 | Hinkel et al. | 315/111.81 |
| 4,412,153 | 10/1983 | Kalbfus et al. | 315/111.81 |
| 4,684,848 | 8/1987 | Kaufman et al. | 315/111.81 |
| 4,697,085 | 9/1987 | Magee et al. | 315/111.81 |
| 4,749,912 | 6/1988 | Hara et al. | 313/230 |

FOREIGN PATENT DOCUMENTS

| 60-189841 | 9/1985 | Japan | 315/111.81 X |
| 2052384 | 3/1987 | Japan . | |

Primary Examiner—David K. Moore
Assistant Examiner—Mark R. Powell
Attorney, Agent, or Firm—Armstrong, Nikaido, Marmelstein, Kubovcik & Murray

[57] ABSTRACT

Ion source including an electric discharge chamber body divided by a partition, having an anode electrode therein, into a main discharge chamber and a subsidiary discharge chamber. The subsidiary discharge chamber has a filament mounted therein aligned with at least one small opening through the partition wall and the anode electrode. An inert gas opening is provided into the subsidiary discharge chamber. An electric discharge gas opening and an ion outlet opening are provided to the main discharge chamber. Magnets are provided outside of the chamber body for creating a magnetic field extending nearly along an axis of the at least one small opening in the anode electrode.

10 Claims, 10 Drawing Sheets

DOUBLE-CHAMBER ION SOURCE

BACKGROUND OF THE INVENTION

This invention relates to an ion source suitably used in an apparatus using ions such as an ion implantation apparatus, an ion microanalyzer, etc.

There has been hitherto known a Freeman type ion source in which a plasma is generated by utilizing a tungsten filament.

In this type of ion source, the tungsten filament is sputtered by the ions, and in a case where a chemically active gas is used as an electric discharge gas, the filament is subjected to a chemical reaction therewith and consequently is worn or damaged easily and remarkably. Therefore, the operation of the ion source has to be stopped for replacement of the filament. Consequently, the apparatus incorporating the ion source also has to be stopped and the operation efficiency of the apparatus is reduced.

In view of the above problems, the applicants of this application have proposed an ion source having an electric discharge chamber partitioned by an anode electrode having a small opening into a main discharge chamber and a subsidiary discharge chamber. A rare gas is introduced into the subsidiary discharge chamber which is provided with the filament. An electric discharge gas for generating the desired ions is introduced into the main discharge chamber. The gas pressure in the subsidiary discharge chamber is kept higher than the gas pressure in the main discharge chamber so that, by effecting a complex electric discharge between the filament, the anode electrode and the main discharge chamber, ions may be generated and, the life of the filament may be prolonged. (Japanese Unexamined Patent Application Kokai (Publication) No. Sho 60 (1985) - 189841).

The foregoing proposed ion source is advantageous in that a chemically active electric discharge gas can be used for a comparatively long time.

OBJECT AND SUMMARY OF THE INVENTION

This invention has for its object to provide an ion source which operates for a comparatively long time and can obtain a large ion current.

According to this invention, for achieving this object, an electric discharge chamber body is partitioned by a partition wall into a main discharge chamber and a subsidiary discharge chamber having a filament therein. These two chambers are brought into communication one with another through a small opening made in an anode electrode provided on the partition wall. A rare gas is introduced into the subsidiary discharge chamber, and an electric discharge gas for generating desired ions is introduced into the main discharge chamber. The gas pressure in the subsidiary discharge chamber is kept higher than a gas pressure in the main discharge chamber. The electric discharge chamber is provided adjacent the outside thereof with a magnet means for creating a magnetic field extending nearly along the axial direction of the small opening.

Next, the operation of the foregoing ion source is as follows:

An inert, rare gas such as Ar gas or the like is introduced into the subsidiary discharge chamber, and, in the meanwhile, an electric discharge gas such as $O_2$ gas or the like which is high in chemical activity is introduced into the main discharge chamber. The gas pressure in the subsidiary discharge chamber is kept higher than the gas pressure in the main discharge chamber. If, then, the filament in the subsidiary discharge chamber is energized, and an anode voltage is applied to the anode electrode having the small opening and the main discharge chamber, plasma is established in the subsidiary discharge chamber between the same and the anode electrode by emission of the thermoelectrons from the filament. Since the gas pressure in the subsidiary discharge chamber is kept higher than the main discharge chamber, the established plasma is jetted into the main discharge chamber through the small opening made in the anode electrode. The electric discharge gas is ionized between the jetted plasma and the main discharge chamber, to produce a large quantity of ions. The ions thus produced are extracted, in the form of a beam, by an extraction electrode means, from an ion beam outlet opening made in one side panel of the main discharge chamber.

The plasma jetted from the subsidiary discharge chamber into the main discharge chamber through the small opening is comparitively small in amount, if the same depends only on the pressure difference between the two discharge chambers. But because of a magnetic field extending along the axial direction of the small opening established by operation of the magnet means provided on the outside of the electric discharge chamber, the plasma can be led longitudinally in the form of a filament or column into the main discharge chamber enough to face the ion outlet opening. As a result, a large amount of ions can be extracted to obtain a large ion current. Further, the ions produced in the main discharge chamber and the neutral gas or active gas in the main discharge chamber never flow back into the subsidiary discharge chamber because of the pressure difference between the two discharge chambers. In this manner, the filament can be prevented from being worn or damaged without being sputtered or chemically reacted with the active gas. Furthermore, since the rare gas is used in the subsidiary discharge chamber, the filament will not be oxidized, and the service life of the filament can be prolonged.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF PREFERRED EMBODIMENTS

Figure 1:
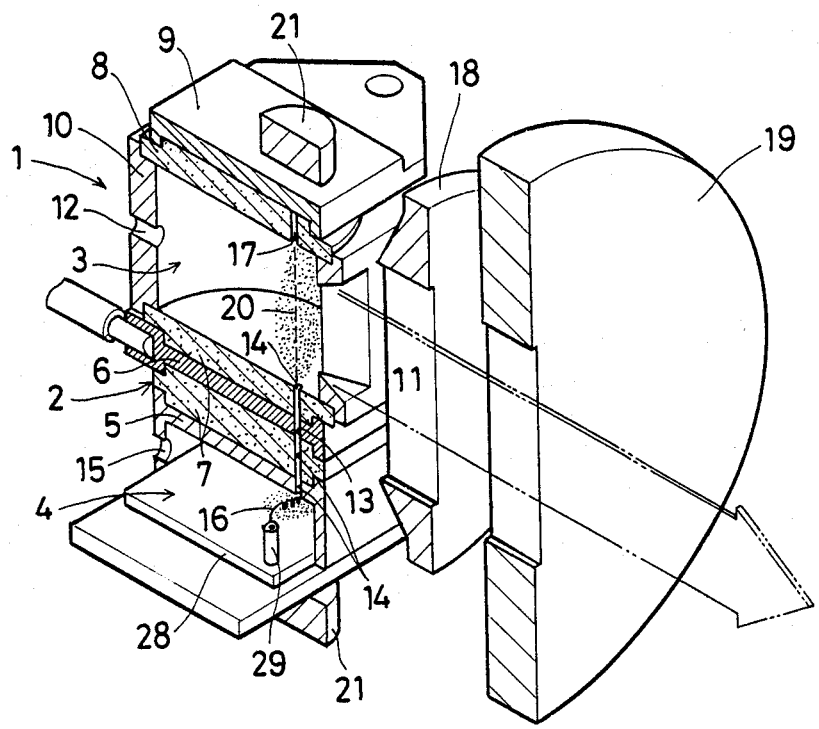
FIG. 1 is a perspective view, partly omitted, of a first embodiment of this invention.

Embodying examples of this invention will now be explained with reference to the accompanying drawings:

Referring to FIG. 1, an electric discharge chamber body 1 is provided having a cylindrical inner space. A partition wall 2 for partitions the electric discharge chamber body 1 into a main discharge chamber 3 at an upper part thereof and a subsidiary discharge chamber 4 at a lower part thereof. In the illustrated example, the partition wall 2 comprises a ceiling plate 5 of the subsidiary discharge chamber 4, and two ceramic panels 7, 7 having an anode electrode in the form of a panel 6 interposed therebetween. The main discharge chamber 3 is constructed by a panel-shaped second anode electric 9 of floating potential carrying a ceramic panel 8 on the inner upper surface thereof. The foregoing partition wall 2, and a peripheral third anode electrode 10 in the form of a circumferential panel define a cylindrical inner space. The third anode electrode 10 is provided on one side wall thereof with a slit-shaped ion outlet opening 11 which is 2 mm in width in the horizontal direction and 25 mm in length in the vertical direction and, on the other side wall thereof, with an electric discharge gas introducing opening 12 for introducing into the main discharge chamber 3 an electric discharge gas comprising an active gas such as $AsF_5$ gas, $O_2$ gas or the like, or an inert gas such as Ar gas or the like into the chamber 3. A conventional means (not shown) is provided for supplying the electric discharge gas to the opening 12. A small opening 13 is made in the anode electrode 6. Extension openings 14, 14, 14 are made in the ceiling panel 5 and the ceramic panels 7, 7 exactly corresponding and connected to the small opening 13 so that the main discharge chamber 3 and the subsidiary discharge chamber 4 may be brought into communication one with another through the extension openings 14, 14, 14 and the small opening 13.

The small opening 13 and the extension openings 14, 14 may be circular in section, for instance, and are made through the partition wall 2 and aligned in a straight communication line. The openings 13 and 14 are preferably situated at a position near the ion outlet opening 11.

An introducing opening 15 is made in the subsidiary discharge chamber 4 for introducing an inert, rare gas such as Ar gas or the like. A conventional means is provided for supplying the inert gas to the opening 15. A filament 16 is provided before an inlet end of the lower extension opening 14 open to the subsidiary discharge chamber 4. A small opening 17 for electric discharging is made in the ceramic panel 8 on the inner surface of the second anode electrode 9 opposite to the extension opening 14 made in the upper panel 7. An extraction electrode means 18, 19 is provided in front of the ion outlet opening 11. Magnets 21, 21 constituting a magnet means are disposed on an upper outside portion of the main discharge chamber 3 and on a lower outside portion of the subsidiary discharge chamber 4 as shown in FIG. 1 or adjacent thereto as shown in FIG. 2 so as to establish a magnetic field 20 in the discharge chambers 3, 4 extending nearly along the axial center line of the small opening 13 of the anode electrode 6.

Figure 2:
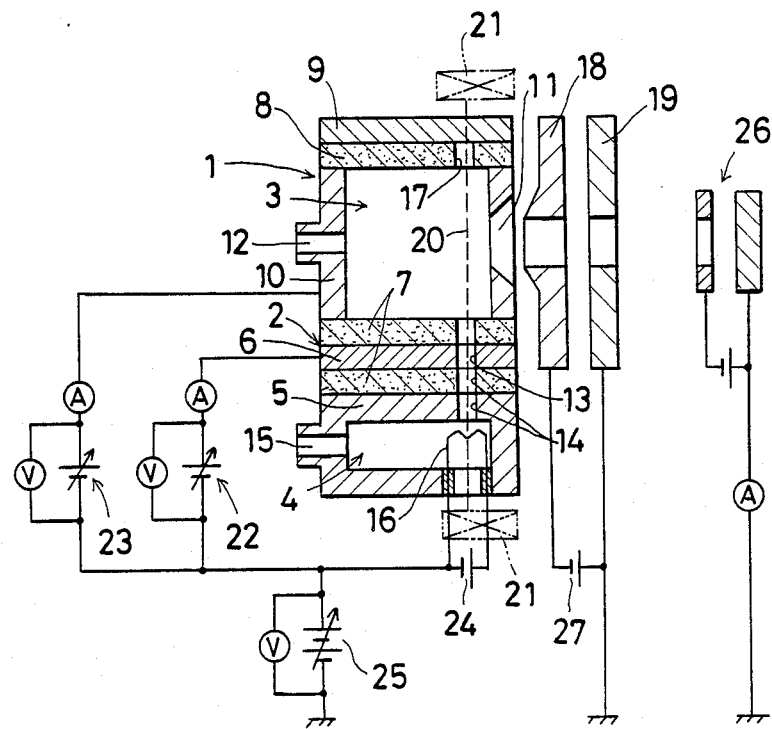
FIG. 2 is a diagram of a wiring arrangement for the example shown in FIG. 1.

FIG. 2 shown a diagram of the embodiment shown in FIG. 1, together with an electric wiring arrangement therefor. A first electric source means 22 for a subsidiary discharge is provided for applying to the anode electrode 6 a potential for an electric discharge in the subsidiary discharge chamber 4. A second electric source means 23 for a main discharge is provided for applying to the third anode electrode 10 is potential for an electric discharge in the main discharge chamber 3. A filament electric source 24 is provided for energizing or heating the filament 16. An extracting electric source 25 is provided for applying to the extraction electrode means 18, 19 a potential for extracting ions generated in the main discharge chamber. A deceleration electric source 27 is provided.

A Faraday cup 26 is provided at a position spaced by 30 cm from the ion outlet opening 11 for measuring an ion current of the beam-shaped ions extracted from the ion outlet opening 11. Further, the filament 16 which is made of an alloy of tungsten wire containing 2% thorium and is 0.6 mm in diameter, for instance, is fixed to an insulation material base 28 by a stainless steel connector 29.

The operation of the foregoing construction is explained below:

Firstly, while the interior of the apparatus (not shown) surrounding the invention is held at a vacuum of $10^{-4}$–$10^{-5}$ torr by a usual means, Ar gas is introduced from the introducing opening 15 at a flow rate of 1.2 sccm so that the degree of a vacuum in the subsidiary discharge chamber 4 becomes 1–0.1 torr, and, at the same time, AsF gas is introduced from the introducing opening 12 so that the degree of vacuum in the main discharge chamber 3 becomes $10^{-2}$–$10^{-3}$ torr. If, then, the respective electric sources 22, 23, 24, 25 are operated, an electric discharge occurs between the filament 16 and the anode electrode 6, under supply of electrons from the filament 16, and a plasma of Ar gas is generated.

This electric discharge is, specifically speaking, a subsidiary electric discharge carried out at an inner surface surrounding the small opening 13 of the anode electrode 6, and if the plasma thereof is jetted into the main discharge chamber 3 through the small opening 13 and the extension small opening 14 on account of the pressure difference between the main discharge chamber 3 and the subsidiary discharge chamber 4, there is induced a main electric discharge between the plasma and the third anode electrode 10 thus establishing a plasma of the ionized $AsF_5$ gas is established.

The plasma flowing from the subsidiary discharge chamber 4 into the main discharge chamber 3 serves as a filament for causing the main electric discharge, but when the inflowing of the plasma depends only on the pressure difference between the two discharge chambers 3, 4, the flowing plasma is diffused and diluted in the main discharge chamber 3, and cannot ionize a greater part of the $AsF_5$ gas. Accordingly, in addition to the pressure difference, when the magnets 21, 21 are operated to establish the magnetic field 20 extending along the axis of the small opening 13. The plasma generated by the subsidiary electric discharge can be jetted largely along the magnetic field 20 in the form of a flame, from the subsidiary discharge chamber 4 into the main discharge chamber 3, resulting in ionizing a greater part of the AsF$_5$ gas. As ions or the like are drawn out in the form of a beam from the ion outlet opening 11 by the extraction electrodes 18, 19.

The amount of the extracted ions are measured as a Faraday cup current (ion current) at the Faraday cup 26. Under the conditions when the electric current given to the filament 16 is 20.5 A, the electric current for the subsidiary electric discharge given to the anode electrode 6 is 3.0 A, and the electric current for the main electric discharge given to the third anode electrode 10 is 1.1 A, there is obtained such a current density, and accordingly, a Faraday cup current, that is gradually increased by increasing the voltage of the extraction electrode means 18, 19 as shown by a curve A in FIG. 3, and there can be obtained the largest amount of ions of 40 mA/cm$^2$ in current density, not shown.

Figure 3:
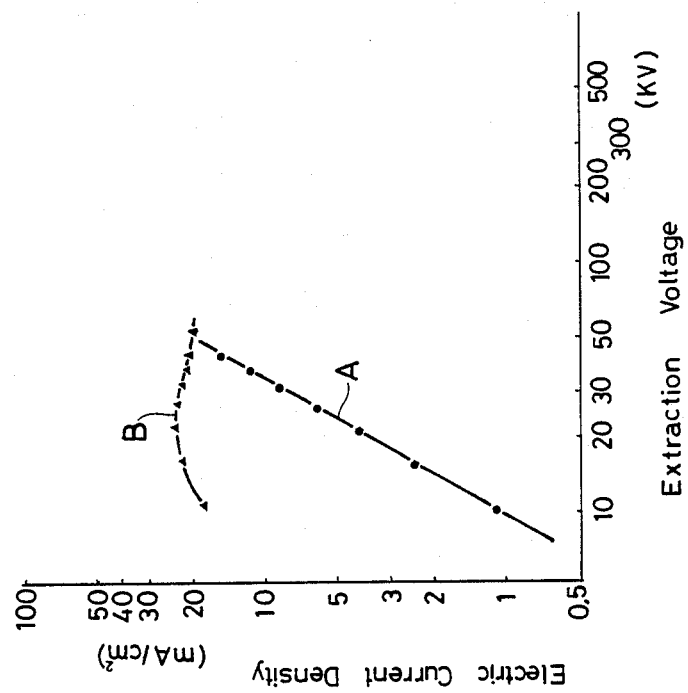

A curve B in FIG. 3 shows an extraction electric current flowing through the extraction electrode means 18, 19. It has been found therefrom the extraction electric current does not largely depend on the increase in the extraction voltage.

Figure 4:
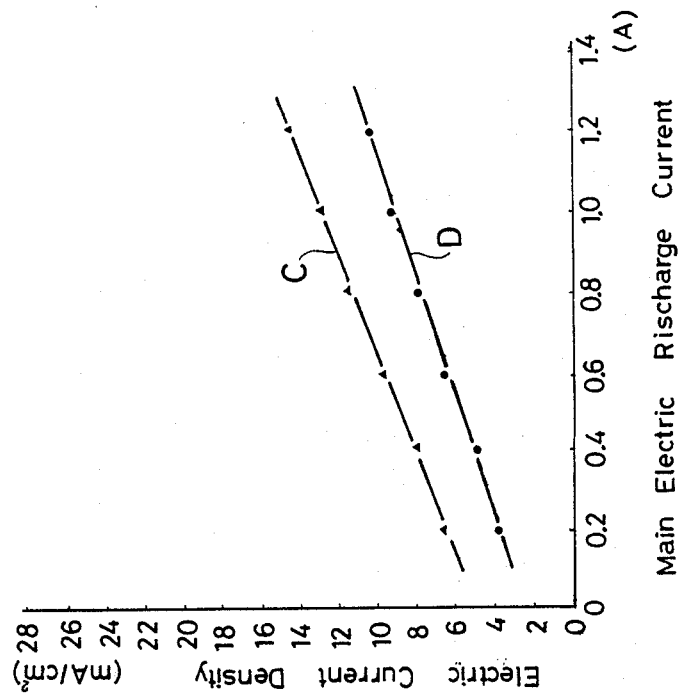
FIGS. 3, 4, and 5 are electric current density diagrams of this invention ion source measured by a Faraday cup.

Additionally, under the operation conditions where, in the apparatus as shown in FIG. 2, Ar gas of 1.2 sccm is introduced into the subsidiary discharge chamber 4, AsF$_5$ gas of 0.3 sccm is introduced into the main discharge chamber 3, the filament 16 is applied with an electric current of 26.5 A from the filament electric source 24, the anode electrode 6 is applied with an electric current of 1.5 A from the first electric source means 22, and the voltage of the extraction electric source 25 of the extraction electrodes 18, 19 is set to be 40 KV, if the electric current of the second electric source means 23 for the main electric discharge is changed, there has been found that the extraction electric current flowing through the extraction electrode means 18, 19 is increased in proportion to an increase in the main electric discharge current as shown by a curve C in FIG. 4. At the same time, the electric current measured at the Faraday cup 26 is also changed in proportion to the change of the main electric discharge current as shown by curve D. Thus, the production amount of ions can be controlled by adjusting the main electric discharge current, and this is convenient for use of the ion source.

Figure 5:
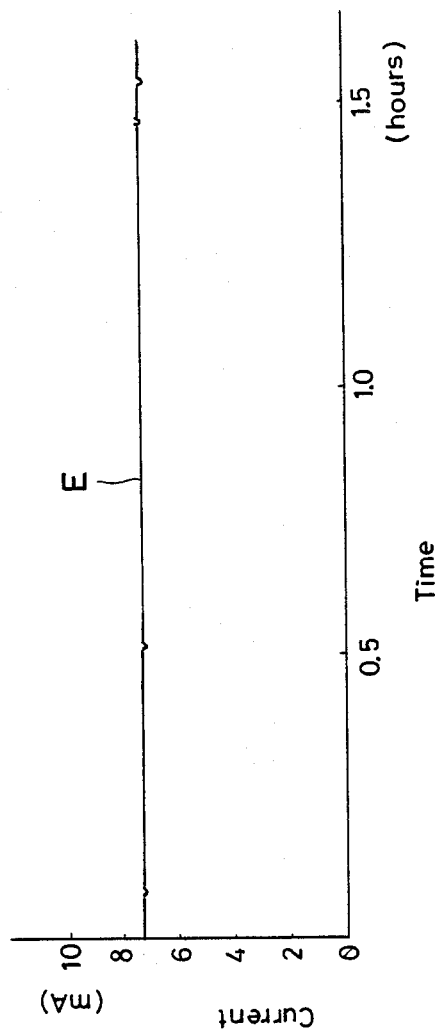

Further, the foregoing ion source is used continuously under the operation conditions wherein Ar gas of 1.2 sccm is introduced into the subsidiary discharge chamber 4, AsF$_5$ gas of 0.3 sccm is introduced into the main discharge chamber 3, an electric current of 20.5 A is applied to the filament 16 from the filament electric source 24, an electric current of 3.0 A is applied to the anode electrode 6 from the first electric source means 22, an electric current of 1.1 A is applied to the third anode electrode 10 from the second electric source means 23, and a voltage of 40 KV is applied to the extraction electrode means 18, 19 from the extraction electric source 25. As a result thereof, it has been found that the electric current measured at the Faraday cup 26 is below 1% in respective of both drift and ripple, and is good in stability as shown by a curve E in FIG. 5. It has been also confirmed that, under the foregoing conditions, a continuous operation can be carried out for about 40 hours which is beyond such a condition 200 mA hours that is the life of a Freeman type ion source.

Even if O$_2$ gas is used instead of the electric discharge gas of the active gas AsF$_5$ introduced into the main discharge chamber 3, there can be obtained stably a large Faraday cup current, that is, a large amount of oxygen ions for a long time. Thus, foregoing ion source can be effectively utilized for forming, for instance, an SiO$_2$ insulation layer of a silicon wafer.

Figure 6:
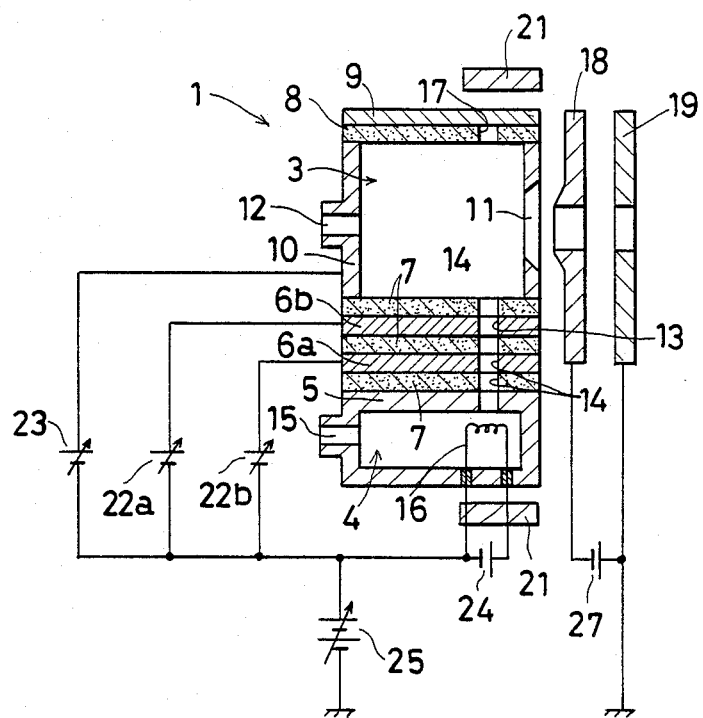
FIG. 6 is a sectional view of a second embodiment of this invention.

FIG. 6 shows a second embodiment having a modified anode electrode 6 having the small opening 13, where at least two anode electrode plates 6a, 6b are arranged in parallel in plural stages. Two electric sources 22a, 22b are provided for supplying electric power to the respective anode electrode plate 6a, 6b. It is preferable to arrange the sources so that the anode electrode plate 6a on the front or lower side is kept more or less higher in potential than the anode electrode plate 6b on the rear or upper side.

According to this two-stage arrangement, the small openings 13 are disposed in two stages in the communication passage connecting between the main discharge chamber 3 and the subsidiary discharge chamber 4. Consequently, the resistance to flow of the communication passage is increased. This arrangement serves to increase the pressure difference between the two chambers 3, 4 and also is advantageous in preventing the active gas or ions in the main discharge chamber 3 from flowing into the subsidiary discharge chamber 4. Additionally, owing to the fact that there exist the two-stage anode electrode plates 6a, 6b in the communication passage, the electric discharge between them and the filament 16 can be facilitated. Further, the plasma is produced in the passage at a comparatively high density, and the high density plasma produced therein is introduced into the main discharge chamber 3 and serves to improve the production of ions in the chamber 3. In this manner, a large quantity of the ions produced in the chamber 3 can be taken out as a large current.

Figure 7:
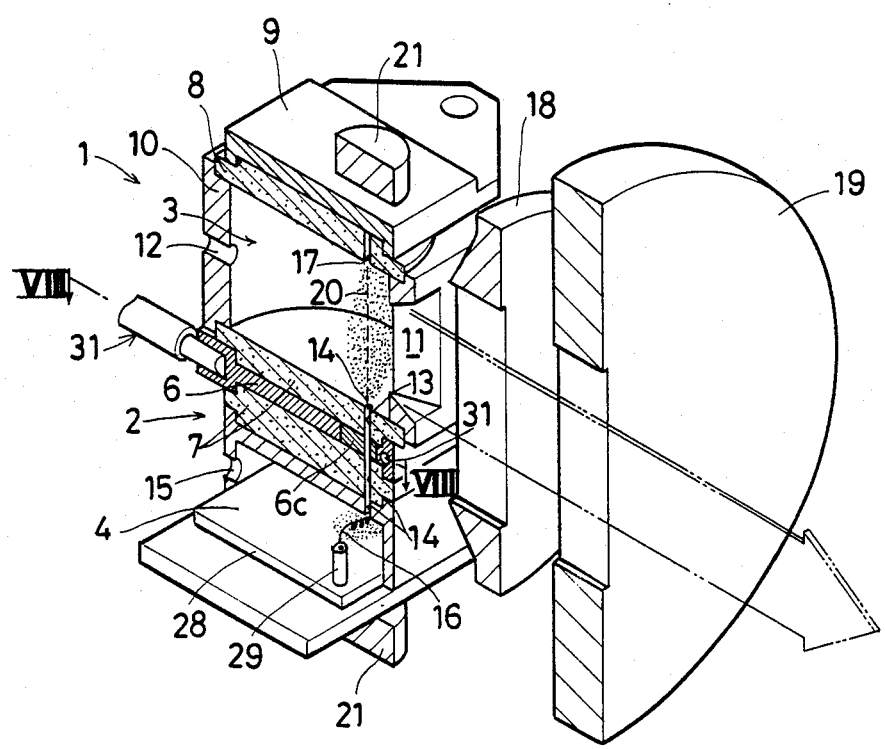
FIG. 7 is a perspective view, partly omitted, of a third embodiment of this invention.
Figure 8:
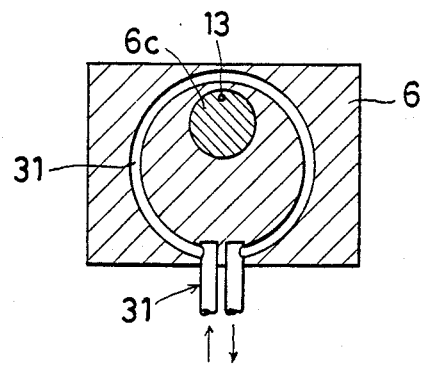
FIG. 8 is a sectional view taken along the line VIII—VIII in FIG. 7.
Figure 9:
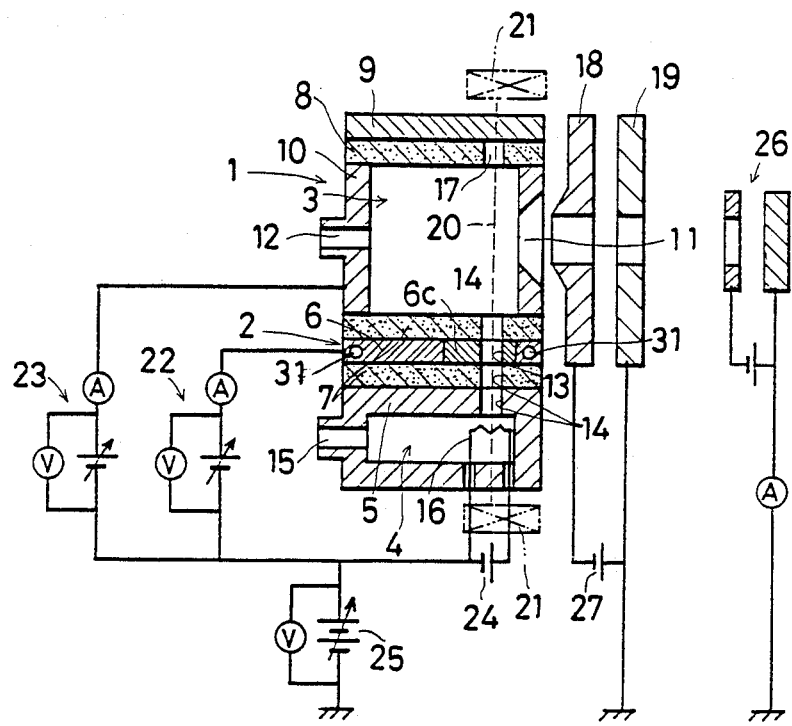
FIG. 9 is a diagram for wiring arrangement for the example shown in FIG. 7.

If the thermoelectrons emitted from the filament 16 go through the inner surface, that is, the surrounding surface of the small opening 13 into the anode electrode 6, the electrode 6 is heated to a high temperature, and will thermally expand. The ceramic panels 7, 7 are liable to be broken by the thermal expansion of the electrode. This problem, however, can be solved by a preventive measure wherein the anode electrode 6 is provided with a cooling means 31 such as a Freon circulation circuit or the like, as shown in FIGS. 7-9. In the embodying example shown in FIGS. 7-9, the anode electrode 6 is made of Cu, and a high thermal load regional part 6c thereof around and in the vicinity of the small opening 13 thereof is formed of a material of Cu-W, for instance, embedded therein.

The ion generating or producing process in this example is substantially equal to that in the example shown in FIGS. 1 and 2, but is different therefrom in that even when the thermoelectrons are rushed into the surrounding inner surface of the small opening 13 of the anode electrode 6 from the filament 16 in order to make the subsidiary electric discharge, owing to the fact that the anode electrode 6 is provided with the cooling means 31 such as a water or Freon circulation or the like for cooling the same, the electrode is cooled so that any trouble because of the electrode 67 thermally expanding to damage the ceramic plate 7 is prevented. Consequently, it makes it possible to use the ion source for a longer time.

Figure 11:
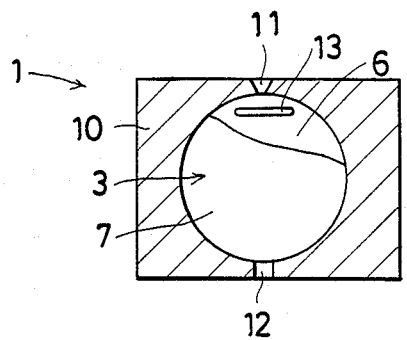
FIG. 11 is a sectional view taken along the line XI—XI in FIG. 10.
Figure 10:
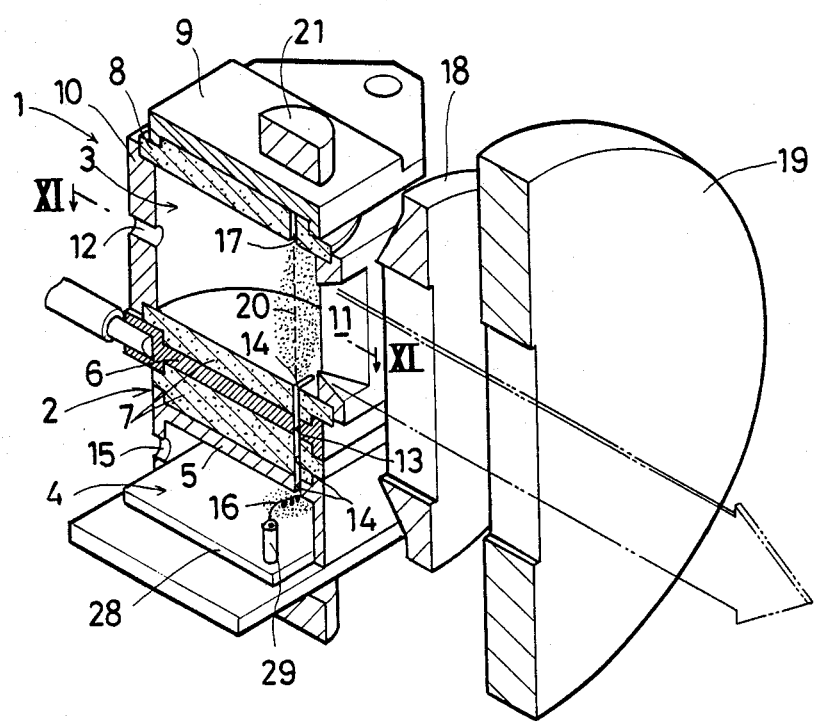
FIG. 10 is a perspective view, partly omitted, of a fourth of this invention.

An embodying example shown in FIGS. 10 and 11 is different from the embodying example shown in FIGS. 1 and 2 in that the small opening 13 of the anode electrode 6 is formed as a slit. In this case also, it is preferable that the slit-shaped small opening 13 is situated near the ion outlet opening 11 made in the side of the main discharge chamber 3. In accordance therewith the extension openings 14, 14 are also formed as slit-shaped ones.

Each slit-shaped small opening 13 and the slit-shaped extension openings 14, 14 is 0.4 mm in width and 4.5 mm in length, for instance, and preferably is oriented so that the broad surface thereof may face the ion outlet opening 11. It is preferable that the small opening 17 made in the ceramic panel 8 put on the inner surface of the second anode electrode 9 be also formed into a slit-shaped one which is nearly equal in size to the small opening 13 and the extension openings 14, 14.

The ion generating process in this embodying example is substantially equal to that in the foregoing example, and the thermoelectrons emitted from the filament 16 rush into the inner surface of the small opening 13 of the electrode 6.

In this case, the small opening 13 is comparatively large in area because it is in the form of the slit, so that the quantity of heat given by the thermoelectrons moving thereinto can be diffused widely towards the surroundings thereof. In this manner, any difficulties in a portion of the anode electrode 6, that is near the small opening 13, being largely expanded by the heat is prevented. Consequently, the ion source can be used for a long time. Additionally, since the slit-shaped small opening 13 is made near the ion outlet opening 11, the sheet-shaped plasma flow can be jetted from the subsidiary discharge chamber 4 into the chamber 3 near the ion outlet opening 11 and a lot of the ions of high density caused by the plasma in the form of a flame or torch can be extracted, without being diffused, from the ion outlet opening 11 by the extraction electrode means 18, 19. Thus, a large ion current of high density can be obtained.

Figure 13:
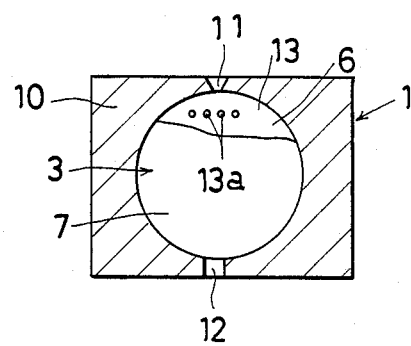
FIG. 13 is a sectional view taken along the line XIII—XIII in FIG. 12.
Figure 12:
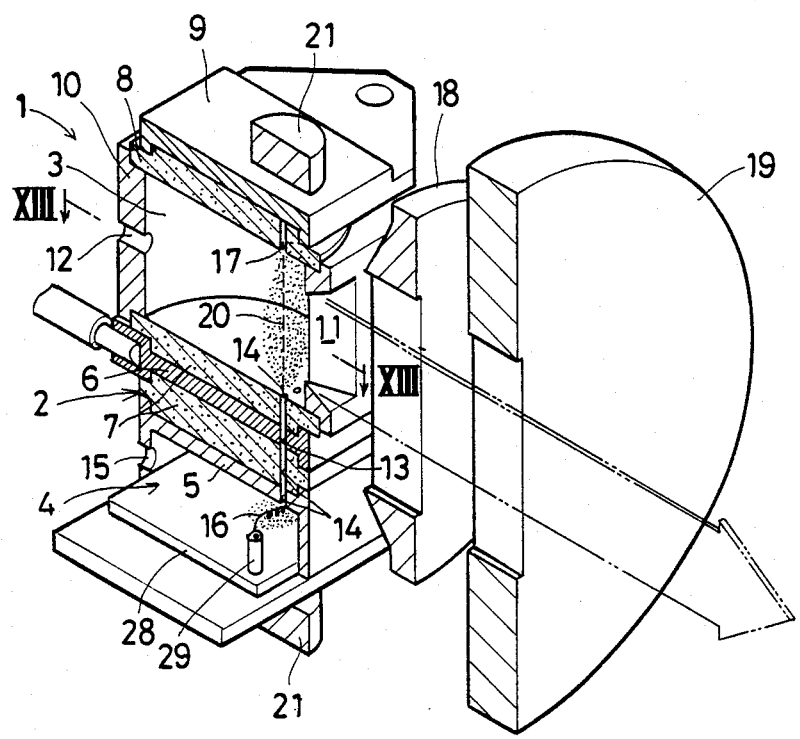
FIG. 12 is a perspective view partly omitted, of a fifth embodiment of invention.

An embodying example shown in FIGS. 12 and 13 is different from the embodying example shown in FIGS. 1 and 2 in that the small opening 13 of the anode electrode 6 is composed of a group of circular small holes 13a, and each of the extension small openings 14, 14 made in the panels 7, 7 in alignment with the small opening 13 is composed of a group of plural circular small holes 14. Each of the small holes 13a and each of the extension slender holes constituting the small openings 14 are respectively 0.5 mm in diameter, for instance. The groups of respective four small holes constituting four communication passages are arranged in a line and are positioned near the ion outlet opening 11. The small opening 17 is made in the ceramic panel 8 put on the inner surface of the second anode electrode 9 is also composed four circular small holes which face the respective communication passages including small holes 13a.

The ion generating process in this embodying example is also substantially equal to that in the example shown in FIGS. 1 and 2, but since the small opening 13 of the anode electrode 6 is composed of a group of plural small holes 13a, the probability of the supply of the thermoelectrons from the filament 16 thereto can be heightened, and consequently the subsidiary electric discharge can be achieved reliably and can be maintained stably. Additionally, owing to the fact that the inner surrounding surface areas of the small opening 13 comprising a group of small holes 13a is increased, the quantity of heat given off by the thermoelectrons running into the anode electrode 6 can be diffused through the anode electrode 6 to the surroundings thereof. Local thermal expansion thereof can be prevented. Consequently, the ceramic panels 7, 7 can be prevented from being broken, and the ion source can be used for a long time. Furthermore, as shown in FIG. 13, by arranging a group of small holes 13a constituting the small opening 13 is a line near the ion outlet opening 11, four flame or column-shaped plasmas can be spouted just before the ion outlet opening 11, and consequently the ions of high density produced by those plasmas can be extracted, without being diffused, from the ion outlet opening 11 by the extraction electrodes 18, 19 to obtain a large ion electric current.

Figure 14:
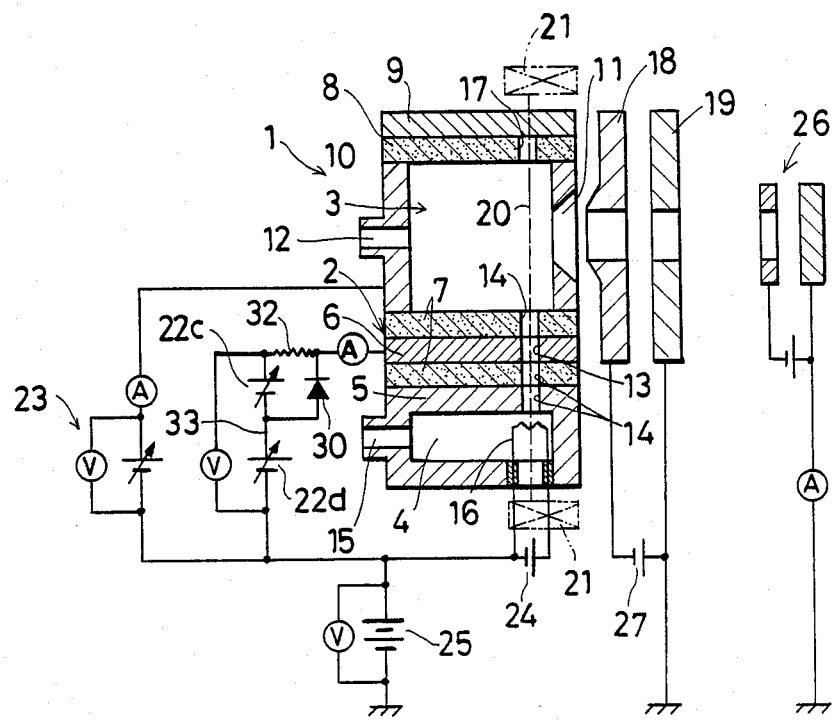
FIG. 14 is an explanation diagram of a sixth embodiment of this invention.

An embodying example shown in FIG. 14 is different from the example shown in FIGS. 1 and 2 in the construction of the electric source 22 for the subsidiary electric discharge to be connected to the anode electrode 6. In this example, the first electric source means 22 for subsidiary electric discharge is constructed by a first electric source 22c of high voltage and small electric current and a second electric source 22d of low voltage and large electric current connected in series one with another and to the anode electrode 6 through a resistance 32. A circuit 33 connecting the two electric sources 22c, 22d is connected to the anode electrode 6 through a diode 30. In this arrangement, an electric source of 1 KV 0.5 A, for instance, is used for the first electric source 22c and an electric source of 160 V, 5 A, for instance, is used for the second electric source 22d.

In this example, until the electric discharge is generated in the subsidiary discharge chamber 4, the anode electrode 6 is applied from the first and second electric sources 22c, 22d with a total voltage of 1160 V, but after the initial generation of the electric discharge, the voltage is lowered and the consumption electric current is increased, so that the anode electrode 6 is applied with a large electric current, not from the first electric source 22c having the resistance 32 interposed therein, but from the second electric source 22d of low voltage of 160 V through the diode 30, and thus the electric discharge in the subsidiary discharging chamber 4 can be maintained. Accordingly, it is sufficient to use two small-sized electric sources as the first electric source means 22 for the subsidiary electric discharge, and it is not necessary to provide a large-sized electric source of high voltage and high electric current. Thus, provision of a surplus power source can be avoided, and the space required for installation of an electric source can be reduced.

Thus, according to this invention, in the type of the ion source comprising the subsidiary discharge chamber for generating plasma of a rare inert gas, and the main discharge chamber which is lower in pressure than the subsidiary discharge chamber and is arranged to be introduced with the plasma through the small opening therefrom, the ion source is provided with the magnet means for establishing the magnatic field extending nearly along the axial direction of the small opening, so that the plasma of the rare gas generated in the subsidiary discharge chamber can be introduced through the small opening into the main discharge chamber in the form of a flame extending along the magnetic field. In this manner, the ionization efficiency of the electric discharge gas can be increased to generate a large quantity of ions. Additionally, the electric discharge gas does not flow back into the subsidiary discharge chamber, and therefore, the ion source can be operated for a long time, by using an active gas such as oxygen gas or the like for the electric discharge gas. Consequently, treating efficiency of a wafer or the like can be increased.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. An ion source for producing ions by means of a plasma comprising:
   an electric discharge chamber body,
   a partition wall dividing an interior space of said body into a main discharge chamber and a subsidiary discharge chamber,
   a filament mounted in said subsidiary discharge chamber,
   an anode electrode provided in said partition wall, said partition wall and said anode electrode each having at least one small opening therethrough which are aligned and communicate said subsidiary discharge chamber with said main discharge chamber and are sized for jetting of a plasma into said main discharge chamber,
   and subsidiary discharge chamber having a rare, inert gas introducing opening therein,
   said main discharge chamber having an electric discharge gas introducing opening therein and an ion outlet opening therein, the gas pressure in said subsidiary discharge chamber being kept higher than the gas pressure in said main discharge chamber, and
   magnet means provided adjacent an outside surface of said body for creating a magnetic field extending nearly along an axis of said at least one small opening of said anode electrode enhancing the jetting of the plasma into said main discharge chamber.

2. An ion source as claimed in claim 1, wherein said anode electrode comprises a pair of parallel anode electrode plates.

3. An ion source as claimed in claim 1, wherein said partition wall comprises two ceramic plates sandwiching said anode electrode therebetween.

4. An ion source as claimed in claim 1, further comprising means for cooling said anode electrode.

5. An ion source as claimed in claim 1, wherein the small opening of the anode electrode is situated near said ion outlet opening made in a side panel of the main discharge chamber.

6. An ion source as claimed in claim 1, wherein the small opening of the anode electrode is in the form of a circle.

7. An ion source as claimed in claim 1, wherein the small opening of the anode electrode is in the form of a slit.

8. An ion source as claimed in claim 1, wherein the small opening is composed of a group of holes.

9. An ion source as claimed in claim 8, wherein the group of holes are arranged in a line.

10. An ion source for producing ions by means of a plasma comprising:
    an electric discharge chamber body,
    a partition wall dividing an interior space of said body into a main discharge chamber and a subsidiary discharge chamber,
    a filament mounted in said subsidiary discharge chamber,
    an anode electrode provided in said partition wall, said partition wall and said anode electrode each having at least one small opening therethrough which are aligned and communicate said subsidiary discharge chamber with said main discharge chamber,
    said subsidiary discharge chamber having a rare, inert gas introducing opening therein,
    said main discharge chamber having an electric discharge gas introducing opening therein and an ion outlet opening therein, the gas pressure in said subsidiary discharge chamber being kept higher than the gas pressure in said main discharge chamber,
    magnet means provided adjacent an outside surface of said body for creating a magnetic field extending nearly along an axis of said at least one small opening of said anode electrode,
    a first electric source of high voltage and small electric current and a second electric source of low voltage and large electric current connected in series one with another and connected to the anode electrode through a resistance, and
    a circuit connecting the two electric sources and connected to the anode electrode through a diode.

* * * * *